(12) United States Patent
Ono et al.

(10) Patent No.: US 6,752,877 B2
(45) Date of Patent: *Jun. 22, 2004

(54) SINGLE WAFER TYPE CLEANING METHOD AND APPARATUS

(75) Inventors: Yuji Ono, Ota-ku (JP); Ryoichi Ohkura, Hachioji (JP)

(73) Assignee: S.E.S. Company Limited, Tokyo (JP)

(*) Notice: Subject to any disclaimer, the term of this patent is extended or adjusted under 35 U.S.C. 154(b) by 96 days.

This patent is subject to a terminal disclaimer.

(21) Appl. No.: 09/948,952

(22) Filed: Sep. 10, 2001

(65) Prior Publication Data

US 2002/0179120 A1 Dec. 5, 2002

(30) Foreign Application Priority Data

May 30, 2001 (JP) ......................................... 2001-161920

(51) Int. Cl.[7] .............................. B08B 3/00; B08B 3/02; B08B 3/04; B08B 3/08
(52) U.S. Cl. ............................ 134/26; 134/33; 134/36; 134/95.3; 134/153; 134/902
(58) Field of Search ............................. 134/26, 33, 36, 134/95.3, 153, 902

(56) References Cited

U.S. PATENT DOCUMENTS

| 6,115,867 | A | * | 9/2000 | Nakashima et al. ............ 15/77 |
| 6,239,038 | B1 | * | 5/2001 | Wen ............................ 438/745 |
| 6,247,479 | B1 | * | 6/2001 | Taniyama et al. .......... 134/95.2 |
| 2002/0195128 | A1 | * | 12/2002 | Shibagaki ..................... 134/26 |

* cited by examiner

*Primary Examiner*—Zeinab El-Arini
(74) *Attorney, Agent, or Firm*—Armstrong, Kratz, Quintos, Hanson & Brooks, LLP

(57) ABSTRACT

A single wafer type wet-cleaning technique for wet-cleaning wafers, individually, which are not stored in a cassette, at the front and back faces thereof simultaneously, in a sealed cleaning housing, whereby a plurality of chemical fluids are vertically and sequentially supplied from a number of upper side supply nozzles 25 and lower side supply nozzles 26 to the front and back faces of each wafer W to clean the same, and purified water is always caused to flow out of the lower side supply nozzles 26, 26, . . . , which do not supply chemical fluids, of the lower side supply nozzles, thereby preventing the occurrence of cross contamination of various chemical fluids between cleaning treatments.

3 Claims, 5 Drawing Sheets

SINGLE WAFER TYPE CLEANING METHOD AND APPARATUS

BACKGROUND OF THE INVENTION

1. Field of the Invention

The invention relates to a single wafer type substrate cleaning method and a single wafer type substrate cleaning apparatus, more particularly to a single wafer type wet-cleaning technique or system for applying a cleaning treatment to substrates such as semiconductor wafers one-by-one during the fabrication process, of semiconductors and devices such as electronic parts, and the like.

2. Prior Art

A so-called batch type wet cleaning system has been the principal method of cleaning substrates such as semiconductor wafers (hereinafter referred to simply as "Wafers"), whereby wafers stored in a carrier cassette are immersed in sequence in wet bench type cleaning baths arranged in series, or wafers are directly immersed in the baths through a transfer unit without being stored in the carrier cassette. However, semiconductor devices have reached the sub micron age, in that they are now micro-fabricated and highly integrated, such that the face of wafers has recently required a very high degree of cleaning density, and wafers which are not stored in a cassette have to be wet-cleaned individually in a sealed cleaning housing. To this end, a so-called single wafer type wet cleaning system intended to meet the requirement of a higher cleaning density has been developed and proposed. The present applicant has improved this single wafer type wet cleaning method, and filed Japanese Patent Application No. 2000-370718 for such improvement. The said invention relates to a method for effectively preventing oxidation on the front faces of wafers while optimizing the benefits of the single wafer type substrate wet-cleaning system for cleaning wafers, individually, which are not stored in a cassette, in a sealed cleaning chamber.

Under the single wafer type wet cleaning system, wafers can be cleaned with the use of a simple and compact cleaning apparatus in a relatively clean atmosphere where particles and the like do not settle or remain on the face of the wafer. This system is therefore practical to use for small scale production.

Generally, under the single wafer type wet cleaning system, the front face, i.e., the upper side surface of the wafer, is cleaned by the application of various chemical fluids in a predetermined order, and recently, a technique whereby both the front and back faces of wafers can be simultaneously cleaned has also been developed. Basically, the back face i.e., the lower side surface of the wafer, is cleaned by the injection and supply of chemical fluids from the lower side surface to the upper side surface of the wafer, giving rise to the probability of cross contamination of the wafer by the different chemical fluids between cleaning treatments. The present invention therefore seeks to address this problem of cross contaminations.

SUMMARY OF THE INVENTION

The object of the invention is to provide a single wafer type wet cleaning technique capable of simultaneously wet cleaning the front and back faces of wafers, individually, which are not stored in a cassette, in a sealed cleaning chamber.

To achieve this object, the proposed invention comprises a single wafer type cleaning method for wet-cleaning wafers, individually, which are not stored in a cassette, in a sealed cleaning housing, whereby the front and back faces of each wafer, which is rotatably supported in the cleaning housing, are vertically and sequentially supplied with various chemical fluids from upper and lower side supply nozzles and purified water is always made to flow out of at least one of the lower side supply nozzles which does not supply any chemical fluid.

In the preferred embodiment, the single wafer type substrate cleaning method further comprises a rinsing treatment of each wafer by supplying purified water from the upper and lower side supply nozzles which supply chemical fluids between cleaning treatments and a cleaning treatment by supplying various other chemical fluids in another series of cleaning treatments, and by causing purified water to continuously flow out of at least one of the lower side supply nozzles upon completion of the rinsing treatment. In this case, it is preferable that the flow of the purified water from the lower side supply nozzle shall be of minimum velocity to prevent the counter flow of chemical fluids other than the chemical fluids supplied from the lower side supply nozzles.

Further, the single wafer type substrate wet-cleaning apparatus of the invention is suitable for carrying out the foregoing cleaning method and comprises (1) wafer rotary means for supporting and rotating a single wafer in the cleaning housing in the horizontal position, (2) a cleaning chamber provided at the outer peripheral portion of the wafer rotary means for forming a cleaning treatment space for cleaning the wafer which is rotatably supported by the wafer rotary means, and (3) chemical fluid supply means for supplying chemical fluids to the front and back faces of the wafer which is rotatably supported by the wafer rotary means, wherein the chemical fluid supply means is provided in the cleaning housing and consists of upper side supply nozzles for supplying chemical fluids to the front face of the wafer from the upper side of the cleaning housing and lower side supply nozzles for supplying the chemical fluids to the back face of the wafer from the lower side thereof, and wherein the upper and lower side supply nozzles vertically and sequentially supply a plurality of chemical fluids to the front and back faces of the wafer which is rotatably supported by the wafer rotary means, thereby cleaning the wafer, and purified water is always made to flow out of the lower side supply nozzles which do not supply chemical fluids, of the lower side supply nozzles, in a series of cleaning steps.

In the preferred embodiment, the upper and lower side supply nozzles are composed of injection nozzles for injecting and supplying the chemical fluids to the front and back faces of each wafer which is rotatably supported by the wafer rotary means, and the number of supply nozzles employed depends on the kind of chemical fluids to be supplied. Further, the lower side supply nozzles are directed upward and located on the upper end portion of the rotatable rotary shaft of the wafer rotary means, and they can communicate with either the chemical fluid supply source or the purified water supply source.

Notably, it is preferable that a gap is established between the inner periphery of the rotary shaft of the wafer rotary means and the outer periphery of the pipe to serve as a supply port of inert gas.

Under the single wafer type cleaning system of the invention, wafers which are not stored in a cassette, are individually cleaned in the sealed cleaning housing, by vertically and sequentially supplying various chemical fluids from the upper and lower supply nozzles to the front and back faces of each wafer which is rotatably supported by the wafer rotary section.

In this case, purified water is always caused to flow out of the lower side supply nozzles which do not supply chemical fluids, of the lower side supply nozzles, in order that cross contamination of such chemical fluids can be prevented between cleaning treatments of the wafers.

In detail, when chemical fluids are supplied to the back face of each wafer from the lower side to the upper side, some of the chemical fluids are prone to remain in the lower side supply nozzles as the lower side supply nozzles are constructed in such manner as to be opened upward. Accordingly, when the cleaning treatment is effected by another chemical fluid upon completion of the cleaning treatment by a particular chemical fluid, the chemical fluid remaining in the lower side supply nozzles in the preceding cleaning treatment(s) mixes with other chemical fluids in the succeeding cleaning treatments, or, chemical fluids supplied between cleaning treatments enter the lower side supply nozzle 26 which is on standby so that such chemical fluids mix with a different kind of chemical fluid remaining in the standby supply nozzle 26, giving rise to a high probability of cross contamination of the chemical fluids between cleaning treatments.

In consideration of the foregoing problem, according to the invention, purified water is always made to flow out of the lower side supply nozzles which do not supply chemical fluids, of the lower side supply nozzles, so that the anticipated occurrence of cross contamination of various chemical fluids between cleaning treatments can be avoided.

Under the single wafer type substrate cleaning system of the invention, a plurality of chemical fluids are sequentially supplied from the upper and lower supply nozzles to the front and back faces of each wafer which is rotatably supported by the wafer rotary means such that each wafer, which is not stored in a cassette, is wet-cleaned in the sealed cleaning housing, wherein purified water is always made to flow out of the lower side supply nozzles which do not supply chemical fluids, of the lower side supply nozzles, so that cross contamination of various chemical fluids between cleaning treatments can be prevented.

In other words, when the supply of chemical fluids to the back face of each wafer is effected from the lower side to the upper side, the chemical fluids which are prone to remain in the lower side supply nozzles because of the upward manner in which they are constructed mix with other chemical fluids supplied between cleaning treatments upon completion of each cleaning treatment by one chemical fluid, as would lead to cross contamination of such chemical fluids. According to the invention, therefore, it is possible to effectively prevent the occurrence of cross contamination of various chemical fluids between cleaning treatments by causing purified water to flow out of the lower side supply nozzles which do not supply chemical fluids, of the lower side supply nozzles.

BRIEF DESCRITPTION OF THE DRAWINGS

PREFERRED EMBODIMENT OF THE INVENTION

The preferred embodiment of the invention is described with reference to the attached drawings.

Figure 1:
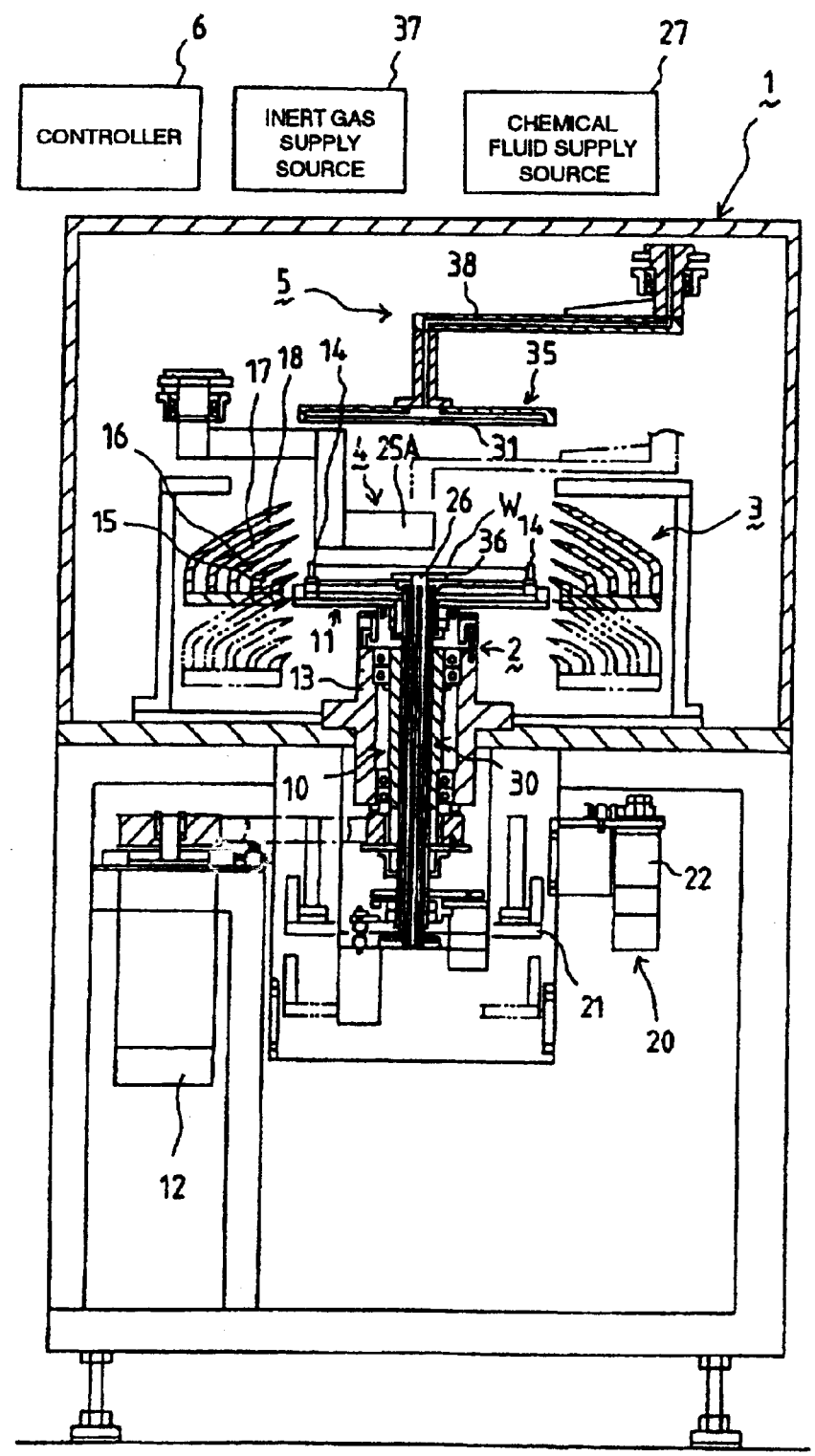
FIG. 1 is a front sectional view showing the internal construction of a single wafer type substrate cleaning apparatus according to the preferred embodiment of the invention.

A single wafer type substrate wet-cleaning apparatus is illustrated in FIG. 1, wherein each wafer W, which is not stored in a cassette, is individually wet-cleaned in a sealed cleaning housing 1, and the sealable cleaning housing 1 comprises a wafer rotary section (wafer rotary means) 2 for rotatably supporting one wafer W in the horizontal position, a cleaning chamber 3 which is relatively vertically movable, a chemical fluid supply section (chemical fluid supply means) 4 for supplying chemical fluids to the front and back faces of the wafer, an inert gas supply section (inert gas supply means) 5 for supplying an inert gas for preventing oxidation, and a controller 6 for controlling these driving sections while interlocking mutually therewith as major components.

The cleaning housing 1 is sealable at the upper portion for the cleaning treatment and serves as a location for installing various unit driving sections at the lower portion disposed in the upper space. A closable wafer taking in-out port, not shown in detail, through which the wafer W is taken in or taken out in the upper space of the cleaning housing 1, is structured in such a way to secure airtightness and water-tightness when it is closed.

The wafer rotary section 2 horizontally rotates a single wafer W while it supports the single wafer W in the horizontal position when the spin cleaning and spin drying treatments are applied thereto, and comprises a rotary shaft 10, a wafer supporting section 11 which is attached to and supported by the upper end portion of the rotary shaft 10 in the horizontal position, and a driving motor 12 for rotatably driving the rotary shaft 10.

The wafer supporting section 11 and the rotary shaft 10 are rotatably disposed at the center of the cleaning housing 1 via a bearing supporting cylinder 13 in a perpendicular position, and the wafer W can be supported by the wafer supporting section 11 in the horizontal position.

Figure 3:
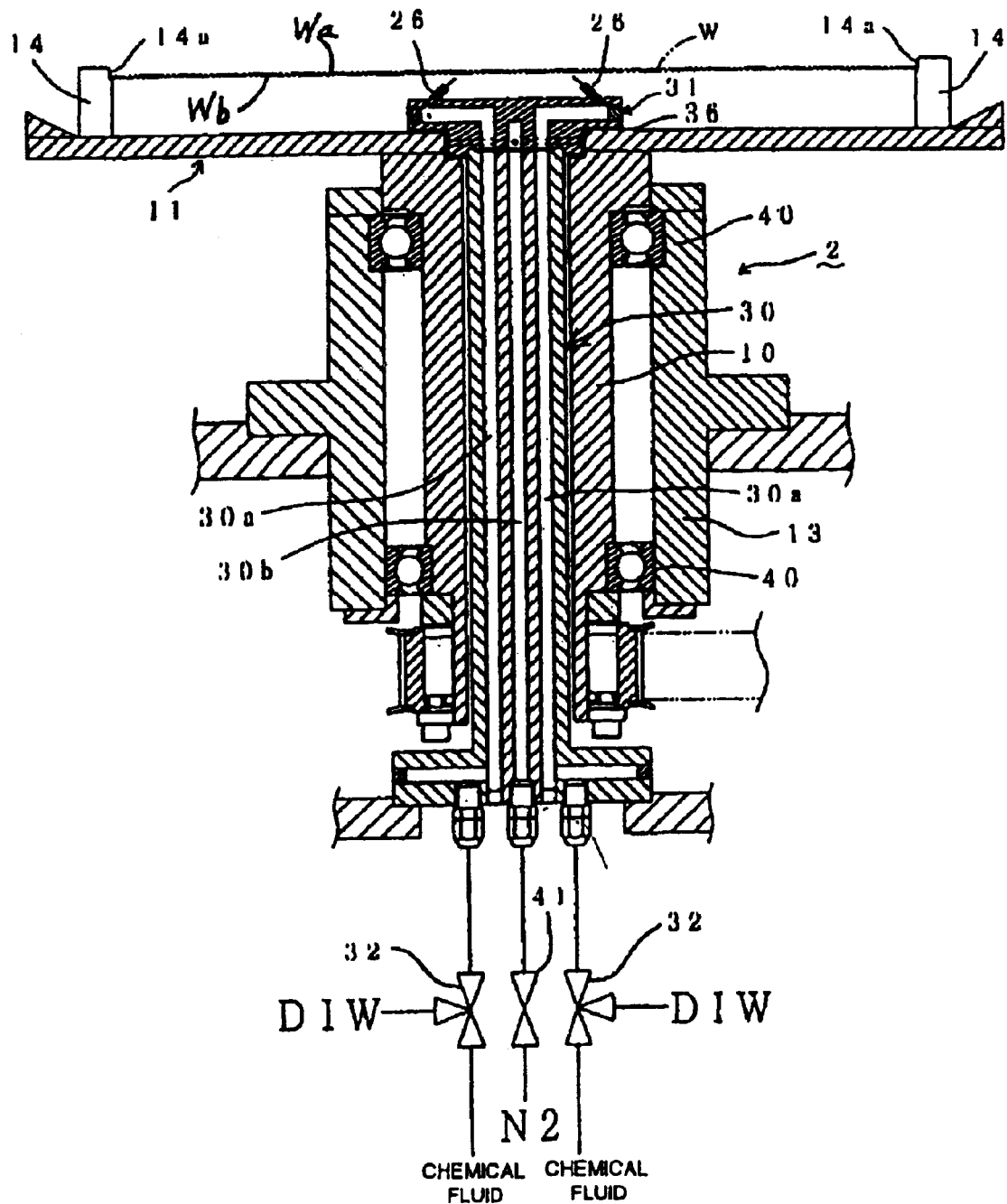
FIG. 3 is an enlarged front sectional view showing the construction of the wafer rotary section and the lower side injection nozzles of the chemical fluid supply section.
Figure 4:
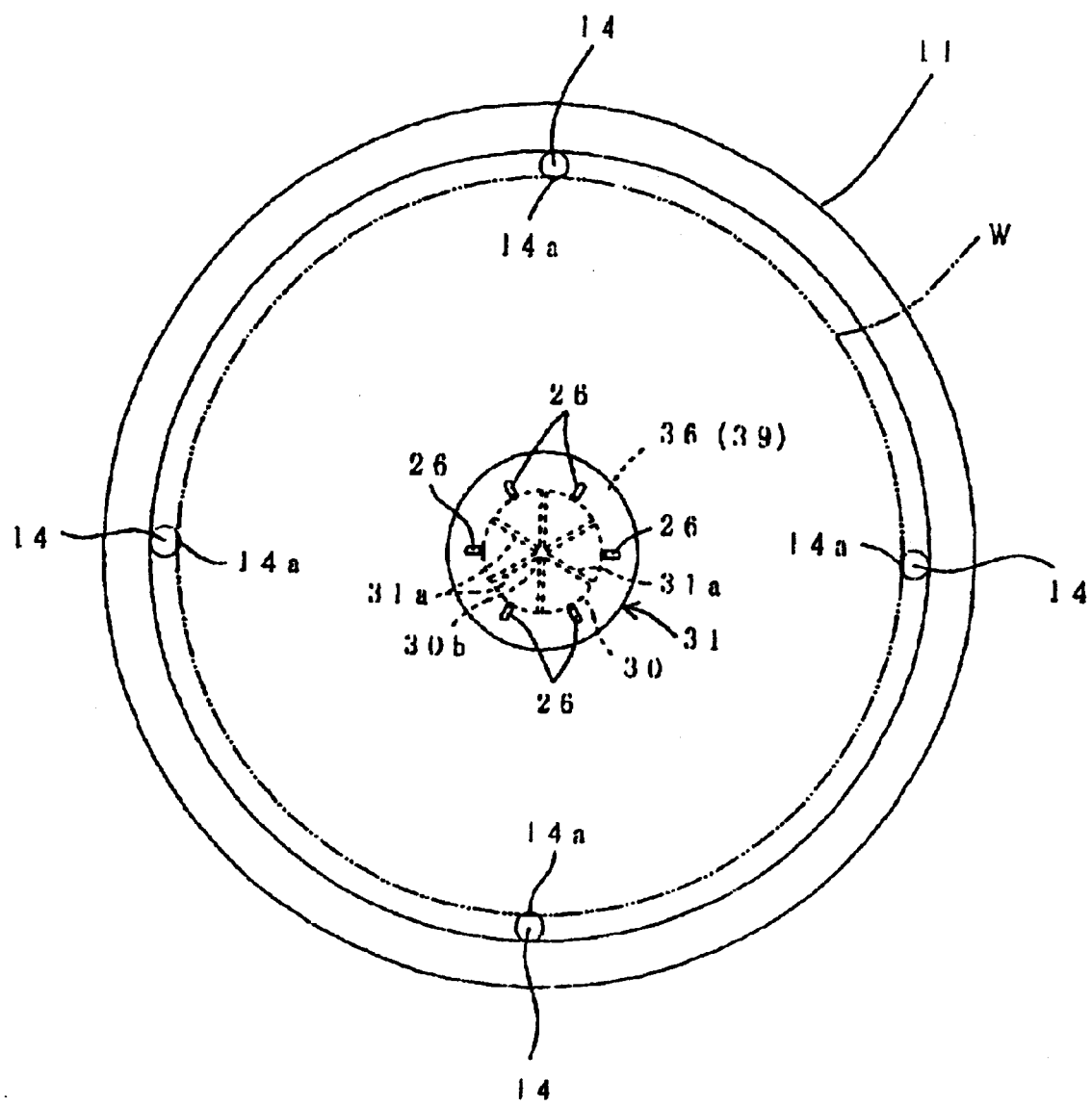
FIG. 4 is an enlarged plan view showing the construction of the wafer rotary section and the lower side injection nozzles of the chemical fluid supply section.

In particular, the wafer supporting section 11 is composed of a disc body, as shown in FIGS. 3 and 4, and has a plurality of columnar supporters, 14, 14, . . . (four pieces of which are shown in FIG. 4) for placing and supporting the peripheral portion of the wafer W on the outer peripheral portion of the upper face thereof.

These supporters 14, 14, . . . are arranged circumferentially on the wafer supporting section 11 with the same intervals as illustrated, and the inner peripheral portion of the upper ends thereof support the peripheral portion of each wafer W to form supporting recesses 14a, 14a, . . . . The supporting recesses 14a, 14a, . . . of these supporters, 14, 14, . . . are designed to have the same height, so that the peripheral portion of the wafer W is supported when it is placed thereon in the horizontal position.

Further, the supporting face of each supporting recess 14a has a configuration corresponding to the contour of the peripheral portion of the wafer W in cross section, and the peripheral edge corner section of each supporting recess 14a can contact and support the square peripheral corner of the wafer W in cross section in a point contact state or line contact state.

The rotary shaft 10 is rotatably supported by a bearing 40 via the bearing supporting cylinder 13 in the standing position, and the lower end portion of the rotary shaft 10 is connected to the driving motor 12 via a belt entrained therebetween so as to be rotatably driven by the driving motor 12 so that the wafer supporting section 11 is rotated at a given speed of rotation. The speed of rotation of the rotary shaft 10 is set at low speed, e.g., 40–50 r.p.m. when the spin cleaning treatment is effected while it is set at high speed of approximately 3000 r.p.m. when the spin drying treatment is effected.

Further, the rotary shaft 10 is composed of a hollow cylindrical body as illustrated, and a pipe 30 for the lower side supply nozzles 26 of the chemical fluid supply section 4, described hereinbelow, which is disposed in the hollow section of the rotary shaft 10.

The cleaning chamber 3 is the section where the cleaning treatment is applied to the wafer W, and the inner diameter dimensions thereof are determined in connection with the wafer supporting section 11 of the wafer rotary section 2, described hereinbelow, and has a cleaning treatment space for cleaning the wafer W, which is rotatably supported by the wafer rotary section 2, at the outer periphery of the wafer rotary section 2.

Figure 2:
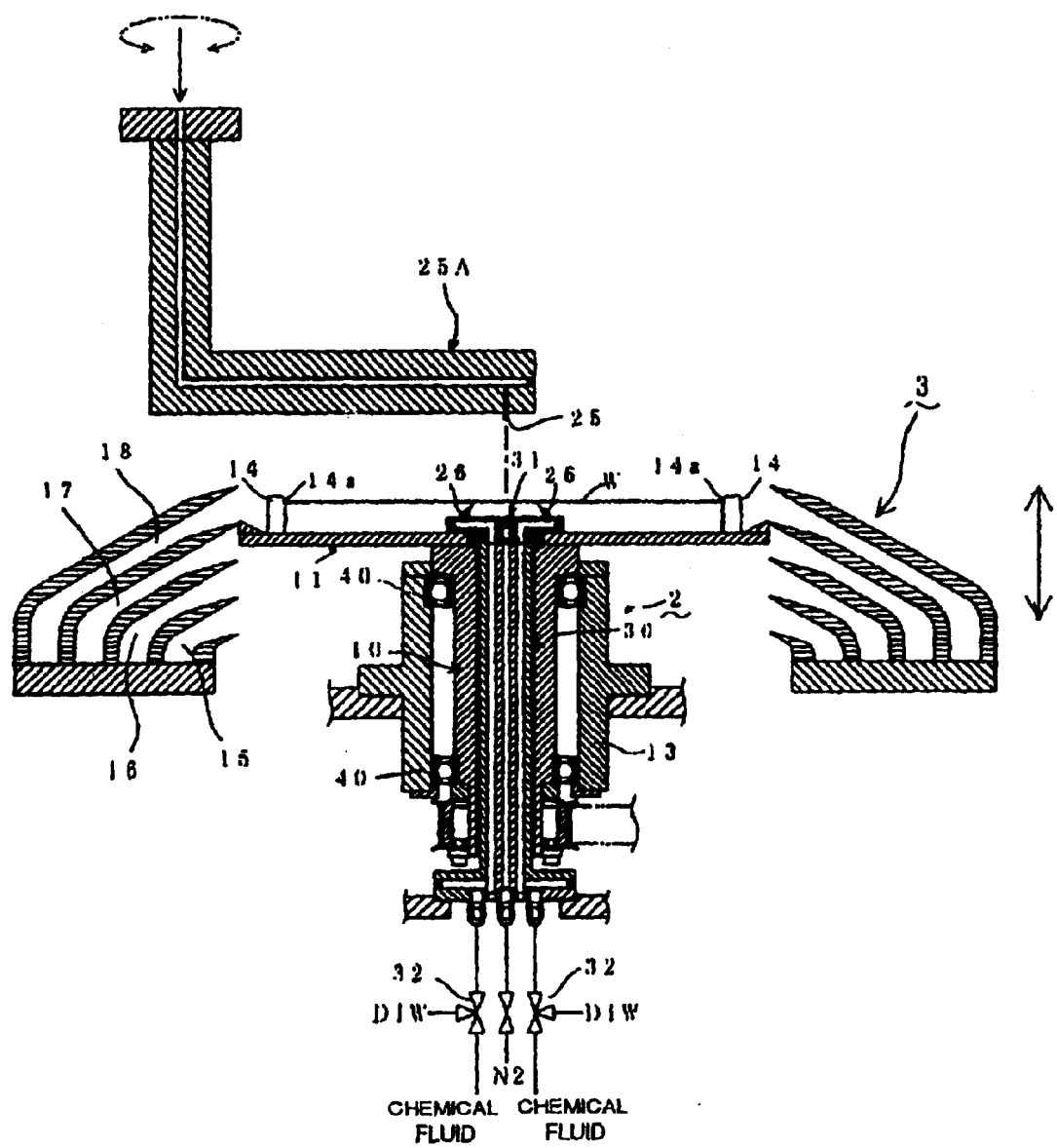
FIG. 2 is an enlarged front sectional view showing the locational relationship between the wafer rotary section, the cleaning housing, and the chemical fluid supply section of the single wafer type substrate cleaning apparatus.

In detail, the cleaning chamber 3 has plural stages of annular treatment baths 15 to 18, which are arranged vertically at the inner periphery thereof as shown in FIGS. 1 and 2, and is constructed to move up and down vertically relative to the wafer rotary section 2.

In the illustrated preferred embodiment, four stages of annular treatment baths 15 to 18 are arranged vertically and concentrically with the wafer W so as to surround the wafer W which is supported by the wafer supporting section 11 of the wafer rotary section 2.

The peripheral inner edges of the annular treatment baths 15 to 18 are arranged in the manner that annular gaps defined between these edges are set to have small intervals to such extent as would prevent the chemical fluids and the like from being leaked downward and at the same time do not contact the outer diameter edge of the wafer supporting section 11 of the wafer rotary section 2.

The cleaning chamber 3 is supported to be movable up and down, i.e. vertically via an elevating guide (not shown), and has an elevating mechanism 20 capable of elevating relative to the wafer supporting section 11 of the wafer rotary section 2 by a given stroke.

The elevating mechanism 20 comprises a feed screw mechanism, (not shown), which moves a supporting frame 21 for supporting the cleaning chamber 3 up and down, and a driving motor 22 for rotatably driving the feed screw mechanism.

Depending on the cleaning treatment step, the cleaning chamber 3 moves up and down vertically by a given stroke via the feed screw mechanism as the driving motor 22 is driven while interlocking with the operation of the wafer rotary section 2, described hereinbelow, so that any one of the annular treatment baths 15 to 18 for effecting the cleaning treatment step may be selected from a position of height relative to the wafer W which is supported by the wafer supporting section 11 of the wafer rotary section 2.

Drain sections, which communicate with the outside of the apparatus, are respectively provided in the four annular treatment baths 15 to 18 (not illustrated in detail). These drain sections discharge or collect for recycling the chemical fluids or the inert gas inside the annular treatment baths 15 to 18, in which they are structured to be opened only when the cleaning treatment is effected and to be closed when the cleaning treatment is effected in other treatment baths.

The chemical fluid supply section 4 supplies the chemical fluids to the front and back faces of the wafer W which is rotatably supported by the wafer rotary section 2, and it has upper side supply nozzles 25 for supplying the chemical fluid to the front face of the wafer W from the upper side thereof and lower side supply nozzles 26 for supplying the chemical fluid to the back face of the wafer W from the lower side thereof.

In detail, these upper side supply nozzles 25 and lower side supply nozzles 26 comprise the injection nozzles for injecting and supplying the chemical fluids to the front face W, and the back face $W_b$ of the wafer W, wherein the number of the supply nozzles to be employed depends on the kind of chemical fluids to be supplied. The upper side supply nozzles 25 and lower side supply nozzles 26 can communicate with the chemical fluid supply source 27 provided outside the cleaning housing 1.

In the illustrated embodiment, the upper side injection nozzles 25 are located in the injection nozzle section 25A which integrally consists of a plurality of nozzle sections, and the injection nozzle section 25A is constructed in such a manner that it may be turned horizontally in a downward direction at the upper portion of the cleaning housing 1, and it is drivably connected to a driving motor capable of being swung, (not shown).

The injection nozzles to be utilized depends on the kind of chemical fluids to be supplied. In particular, these four upper side injection nozzles 25, 25, . . . which are provided in the injection nozzle section 25A, (not shown), are intended to serve as supply ports for APM fluid, purified water, and DHF fluid, described hereinbelow.

The upper side injection nozzles 25 of the injection nozzle section 25A are constructed in such a way as to inject and supply given chemical fluids to the front face Wa of the wafer W which is rotatably supported by the wafer supporting section 11 of the wafer rotary section 2 in the horizontal position while it is turned horizontally from the outer region toward the center thereof or when it stands still after being turned horizontally.

The lower side injection nozzle 26 is provided on the upper end portion of the rotatable rotary shaft 10 of the wafer rotary section 2, and it is firmly provided relative to the back face $W_b$ of the wafer W extending in an upward direction. In the illustrated preferred embodiment, two sets of lower side injection nozzles 26, 26, . . . are disposed corresponding to the upper side injection nozzles 25, 25, . . . respectively for APM fluid, purified water and DHF fluid. In particular, a total of six lower side injection nozzles are provided as shown in FIG. 4.

Figure 5:
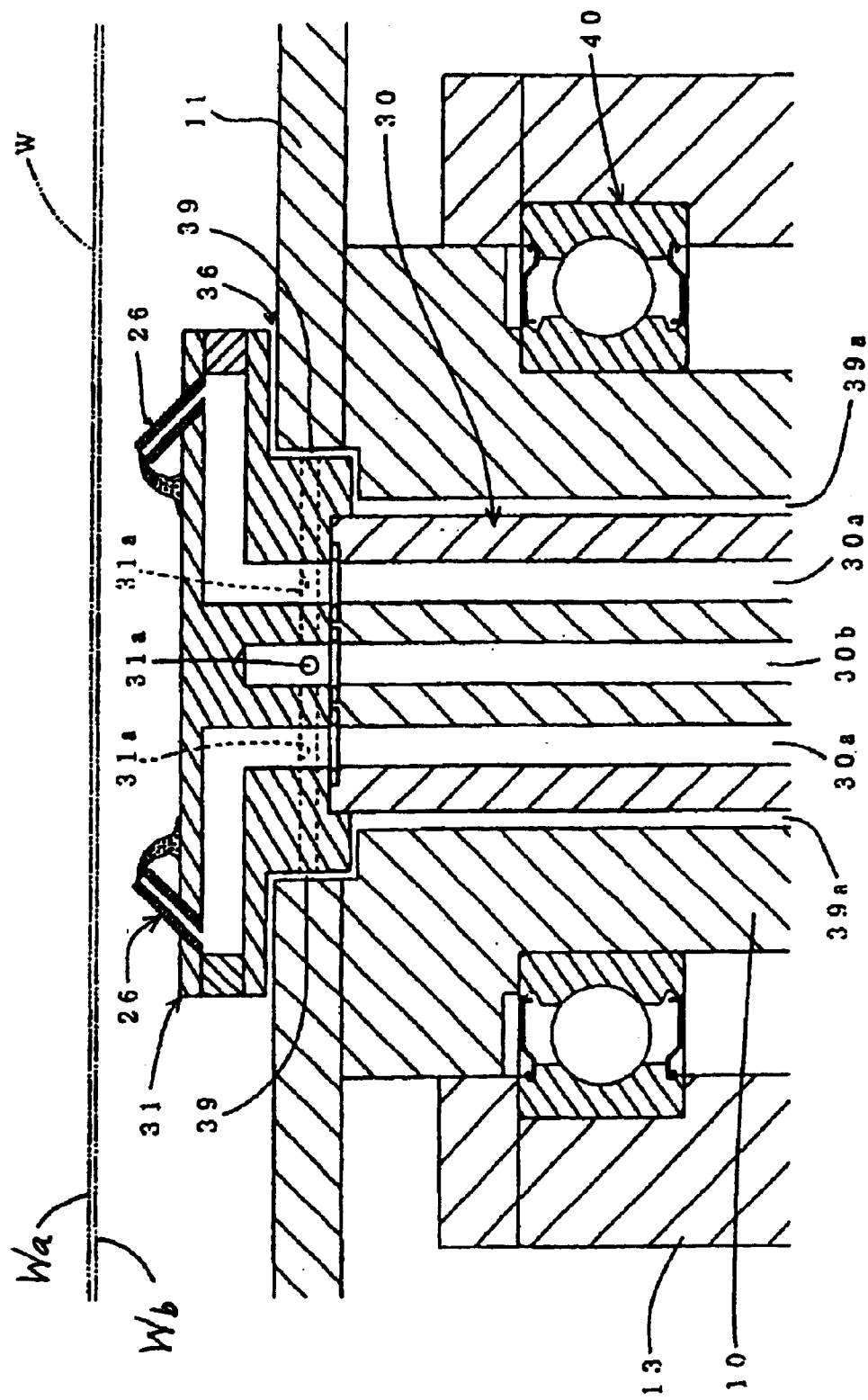
FIG. 5 is an enlarged front view showing the lower side injection nozzles of the chemical fluid supply section and the peripheral construction thereof.

These lower side injection nozzles 26, 26, . . . can communicate with the chemical fluid supply source 27 via the pipe 30 disposed inside the rotary shaft 10 as shown in FIGS. 3 to 5.

In detail, the pipe 30 vertically penetrates the hollow section of the rotary shaft 10 composed of a hollow cylindrical body and is firmly disposed on the rotary shaft 10 by a supporting structure, (not shown), while it does not contact the rotary shaft 10.

A discoid chemical fluid supply section 31 is affixed to the upper end portion of the pipe 30 and six lower side supply nozzles 26, 26, . . . are disposed circumferentially on the upper face of the chemical fluid supply section 31 at the same intervals, wherein each lower side injection nozzle 26 is in an upward slanting position relative to the center of the back face $W_b$ of the wafer W which is rotatably supported by the wafer rotary section 2.

These lower side supply nozzles 26, 26, . . . communicate with the chemical fluid supply passages 30a, 30a, . . . which are located within the pipe 30. The chemical fluid supply passages 30a, 30a, . . . can selectively communicate with the supply source of the chemical fluids (APM fluid and DHF fluid) of the chemical fluid supply source 27 or the supply source of purified water via a directional control valve 32 at the lower end portion of the pipe 30. The chemical fluid supply passages 30a, 30a, . . . also communicate with the upper side injection nozzles 25, 25, . . . .

The chemical fluid supply source 27 is the supply source for supplying chemical fluids to the upper side injection nozzles 25, 25, . . . , and lower side injection nozzles 26, 26, . . . ; and in the illustrated embodiment, has two chemical fluid systems, from which either a construction for cleaning the wafer W by APM ($NH_4OH+H_2O_2+H_2O$) fluid or a construction for cleaning the wafer W by DHF ($HF+H_2O$) fluid may be selected, while the annular treatment baths 15 to 18 in the cleaning chamber 3 correspond to these two chemical fluid supply systems, such that, the lowermost stage treatment bath 15 is used for the cleaning step by APM fluid, the third upper stage treatment bath 16 is used for the cleaning step by DHF fluid, while the second upper stage treatment bath 17 is used for the rinsing step by purified water, and the uppermost stage treatment bath 18 is used for the spin drying step.

Further, the chemical fluid supply source 27 is constructed to select and effect the cleaning steps using any of the following recipes of chemical fluids: i) APM+DHF+($O_3$+DIW)+DRY, ii) APM+DHF+DRY, iii) APM+DRY, DHF+DRY or the like with the cooperation of an inert gas supply source 37, described hereinbelow.

As described later, the upper side injection nozzles 25, 25, . . . and lower side injection nozzles 26, 26, . . . sequentially supply a plurality of chemical fluids downwardly and upwardly to the front and back faces $W_a$ and $W_b$, of each wafer W, which is rotatably supported by the wafer rotary section 2, in accordance with the recipe which was selected from any of the abovementioned combinations i) to iii), thereby cleaning the wafer W, and they are driven and controlled to ensure that purified water is always made to flow out of the lower side supply nozzle 26 which does not supply chemical fluids in the series of cleaning steps.

The inert gas supply section 5 supplies an inert gas for preventing oxidation to the front and back faces of each wafer W which is rotatably supported by the wafer rotary section 2 and is composed of an upper side supply section 35 for supplying an inert gas to the front face of each wafer W and a lower side supply section 36 for supplying inert gas to the back face of each wafer W as major components, wherein the upper side supply section 35 and the lower side supply section 36 can communicate with the inert gas supply source 37 provided outside the cleaning housing 1. In the illustrated preferred embodiment, the inert gas is a nitrogen gas (hereinafter, the "$N_2$ gas").

The upper side supply section 35 is provided at the upper portion of the cleaning housing 1 and comprises a circular cover body for forming a drying sealed space at the periphery of the front face of each wafer W which is rotatably supported by the wafer rotary section 2 while cooperating with the cleaning chamber 3.

In detail, the outer diameter edge of the upper side supply section 35 is designed to closely engage with the inner diameter edge of the cleaning chamber 3, i.e., the outer diameter edge of the uppermost stage treatment bath 18, so that the requisite minimum drying sealed space is formed at the periphery of the front face of each wafer W which is rotatably supported by the wafer rotary section 2. The upper side supply section 35 communicates with the inert gas supply source 37 via a pipe 38.

The upper side supply section 35 is vertically movable between the use position (not shown) cooperating with the cleaning chamber 3 and the use standby position, i.e., the position of height shown in FIG. 1 which does not interfere with the chemical fluid supply section 4, and is drivably connected to an elevating means, not shown.

The lower side supply section 36 is provided on the upper end portion of the rotatable rotary shaft 10 of the wafer rotary section 2 in the same manner as the lower side injection nozzle 26 is provided in the chemical fluid supply section 4.

In detail, as shown in FIG. 5, a gap 39 defined between the hollow inner peripheral portion of the rotary shaft 10 of the wafer rotary section 2 at its upper end and the outer peripheral portion of the pipe 30, i.e., the chemical fluid supply section 31, serves as the supply port of the lower side supply section 36.

As shown in FIG. 5, the supply port 39a of the lower side supply section 36 opens to access the entire periphery of the cleaning apparatus in a horizontal radial direction in the interval between the lower face of the chemical fluid supply section 31 and the upper face of the wafer supporting section 11, and communicates with an inert gas supply passage 30b defined by penetrating the inner center of the pipe 30 via communication sections 31a, 31a, . . . which are defined by penetrating the chemical fluid supply section 31 in a horizontal radial direction, wherein the inert gas supply passage 30b can communicate with the inert gas supply source 37 via a directional control valve 41 at the lower end portion of the pipe 30.

The lower side supply section 36 serves to prevent various apparatus driving sections from being corroded inside the lower portion of the cleaning housing 1, which ensues from the backflow of the chemical fluid into the gap 39 defined between the hollow inner peripheral portion of the rotary shaft 10 and the outer peripheral portion of the pipe 30, and so the inert gas is always to be injected and supplied from the lower side supply section 36.

The inert gas supply section 5 having such a construction operates as the wafer W is cleaned or the chemical fluid inside the cleaning chamber 3 is discharged and replaced by another chemical fluid.

The controller 6 controls the movements of the components of the single wafer type substrate cleaning apparatus while interlocking with these components, thereby automatically effecting the following series of wet treatment steps:

(1) Prior to the application of the cleaning treatment, the wafer W is taken into the wafer supporting section 11 inside the cleaning chamber 3 via the wafer taking in/out port of the cleaning housing 1, (not shown), and after the cleaning chamber 3 is sealed, the wafer W is placed in the cleaning treatment position inside the cleaning chamber 3 by the up and down movement of the cleaning chamber 3. Thereafter, the foregoing various cleaning treatments are effected in a predetermined procedure.

(2) For example, if the cleaning treatment is in the foregoing ii) cleaning treatment step (APM+DHF+

DRY), the wafer W on the wafer supporting section 11 is first positioned and disposed in the lowermost stage treatment bath 15 and while the cleaning chamber 3 moves up and down the APM fluid is injected and supplied from the upper side injection nozzles 25, 25, . . . and lower side injection nozzles 26, 26, . . . while $N_2$ gas is injected and supplied from the lower side supply section 36 of the inert gas supply section 5, and the spin cleaning treatment is applied to the wafer W as the wafer rotary section 2 rotates at low speed.

In this case, purified water is always made to flow out of the lower side supply nozzle which does not supply chemical fluids, particularly, from the supply nozzles 26 other than those which supply APM fluid. The flow of the purified water from the lower side injection nozzle 26 shall be have a velocity lower than the flow of chemical fluids supplied and ejected therefrom, in order to prevent the counter flow of chemical fluids other than the chemical fluid supplied from the lower side injection nozzle 26. The outflow of the chemical fluid from the lower side injection nozzle 26 shall be in such state where it runs and sags as shown in FIG. 5.

(3) Subsequently, the wafer W is positioned and disposed in the second upper stage treatment bath 17, and purified water is injected and supplied from all of the upper side injection nozzles 25 and lower side injection nozzles 26 while $N_2$ gas is supplied and ejected to the wafer W from the lower side supply section 36 of the inert gas supply section 5, so that the rinsing treatment is applied to the wafer W as the wafer rotary section 2 rotates at low speed.

Upon completion of the rinsing treatment, the upper side injection nozzles 25 and lower side injection nozzles 26 are shifted to an outflow operation of purified water at the flow velocity set forth above to ensure that purified water continuously flows out.

(4) Further, the wafer W is positioned and disposed in the third upper stage treatment bath 16, and the DHF fluid is supplied from the upper side injection nozzles 25 and lower side injection nozzles 26 while $N_2$ gas is supplied and injected from the lower side supply section 36 of the inert gas supply section 5, and the spin cleaning treatment is applied to the wafer W as the wafer rotary section 2 rotates at low speed.

In this case, the outflow operation of purified water is continuously effected from the lower side injection nozzle 26 which does not supply chemical fluids, particularly from the injection nozzles 26 other than those which supply DHF fluid.

(5) Further, the wafer W is positioned and disposed in the second upper stage treatment bath 17, and purified water is supplied from all of the upper side injection nozzles 25 and lower side injection nozzles 26 while $N_2$ gas is injected and supplied from the lower side supply section 36 of the inert gas supply section 5, and the rinsing treatment is applied to the wafer W as the wafer rotary section 2 rotates at low speed.

(6) Finally, the wafer W is positioned and disposed in the uppermost stage treatment bath 18, while $N_2$ gas is supplied and injected from the upper side supply section 35 and lower side supply section 36 of the inert gas supply section 5, and the spin drying treatment is applied to the wafer W as the wafer rotary section 2 rotates at high speed.

In the drying step, the upper side supply section 35 of the inert gas supply section 5 is lowered to the use position while cooperating with the cleaning chamber 3, so that it forms a drying sealed space while cooperating with the cleaning chamber 3, and thereafter $N_2$ gas is supplied to and fills the drying sealed space.

Accordingly, when contents of the drying sealed space are purged and replaced by $N_2$ gas, or when occasion demands, air current is produced in the passage extending from the inert gas supply section 5 to the drain section inside the drying sealed space owing to the forceful air discharge from the drain section of the uppermost stage treatment bath 18, the concentration of oxygen on the periphery of the entire front face of the wafer W becomes substantially zero (0), and thereafter the spin drying treatment is applied to the wafer W.

(7) The wafer W is again taken out via the wafer taking in/out port of the cleansing housing 1 upon completion of the series of cleaning treatments in the single wafer type substrate cleaning apparatus.

Under the single wafer type substrate cleaning apparatus having the foregoing construction, a plurality of chemical fluids is sequentially supplied downwardly from the upper side injection nozzles 25 and upwardly from the lower side injection nozzles 26 to the front and back faces of each wafer W which is rotatably supported in the sealed cleansing housing 1 so as to wet clean it. Particularly, purified water is made to flow out of the lower side supply nozzles 26, 26, which do not supply chemical fluids so that cross contamination of various chemical fluids which occurs between cleaning treatments can be prevented effectively.

In other words, the supply of the chemical fluids to the back face $W_b$ of the wafer W is normally effected from the lower side toward the upper side but since the lower side supply nozzles 26 are structurally installed to open upwardly, the chemical fluids are prone to remain in the lower side supply nozzles 26, 26 . . . . Accordingly, when the cleaning treatments are effected by other types of chemical fluids in succession, the chemical fluids that remain in the lower side supply nozzles 26, 26 . . . , inevitably mix with the other chemical fluids between cleaning treatments or, chemical fluids supplied between cleaning treatments enter the lower side supply nozzle 26 which is on standby so that such chemical fluids mix with a different kind of chemical fluid which remains in the standby supply nozzle 26, giving rise to the probability of cross contamination in succeeding cleaning treatments.

To address the foregoing problems, the single wafer type substrate cleaning apparatus of the proposed invention, will cause purified water to always flow out of the lower side supply nozzles 26, 26, . . . which do not supply chemical fluids, so as to effectively prevent the occurrence of cross contamination of various chemical fluids between cleaning treatments.

Although the foregoing embodiment is the preferred embodiment of the invention, the invention is not limited to the foregoing embodiment but can be redesigned and modified within the scope of the invention.

For example, while two sets of the lower side supply nozzles 26 for supplying APM fluid, purified water, and DHF fluid, totaling six (6) are arranged in the manner illustrated in the preferred embodiment, they can be used in such a way that one lower side injection nozzle 26 may be used for supplying APM fluid and one lower side injection nozzle 26 may be used for supplying DHF fluid, then two lower side injection nozzles 26 may be used for supplying purified water while the remaining two other lower side injection nozzles 26, 26 may be used for supplying $N_2$ gas for drying the back face of the wafer W, and these nozzles can be alternately selected and used.

Further, while the single wafer type substrate cleaning apparatus can be used as a single apparatus, it can also be used as a basic construction element of a wafer cleaning system provided with a loading section, an unloading section or other types of equipment such as placing and mounting robots and the like.

Further still, the chemical fluids employed by the preferred embodiment are mere samples, and hence other chemical fluids such as HPM ($HCL+H_2O_2+H_2O$), SPM ($H_2SO_4+H_2O_2+H_2O$), and the like can be used depending on the object thereof.

What is claimed is:

1. A single wafer substrate cleaning method for wet-cleaning wafers which are not stored in a cassette individually, in a sealed cleaning housing, said method comprising the steps of:

rotating each wafer in a substantially horizontal plane in the cleaning housing;

sequentially supplying a plurality of chemical fluids downwardly and upwardly to front and back faces of said wafer from upper and lower side supply nozzles so as to clean each wafer; and simultaneously causing purified water to continuously flow out of a plurality of lower side supply nozzles in streams positioned alternately with respect to streams of chemical fluids of lower supply side nozzles therefor.

2. The single wafer substrate cleaning method according to claim 1, comprising the further steps of:

when, during a series of cleaning treatments by a plurality of cleaning fluids, a rinsing treatment by purified water is effected intermediate a cleaning treatment by initially supplied other chemical fluid and subsequently supplied other chemical fluid, supplying purified water from the upper and lower side supply nozzles which initially supply chemical fluid; and causing purified water to continuously flow out of the lower side supply nozzles which do not supply chemical fluids, upon completion of the rinsing treatment.

3. The single wafer substrate cleaning method according to claim 1 or 2, wherein the flow of purified water from the lower side supply nozzles is of minimum velocity to prevent counterflow of chemical fluids other than the chemical fluids supplied from the lower side supply nozzles.

* * * * *